United States Patent [19]

Neuwald

[11] Patent Number: 4,478,878
[45] Date of Patent: Oct. 23, 1984

[54] METHOD FOR THE PREPARATION OF METAL-FREE STRIPS IN THE METAL VAPOR DEPOSITION OF AN INSULATING TAPE

[75] Inventor: Anselm Neuwald, Bad Abbach, Fed. Rep. of Germany

[73] Assignee: Siemens Aktiengesellschaft, Berlin and Munich, Fed. Rep. of Germany

[21] Appl. No.: 410,478

[22] Filed: Aug. 23, 1982

[30] Foreign Application Priority Data

Sep. 1, 1981 [DE] Fed. Rep. of Germany ....... 3134589
Jun. 29, 1982 [DE] Fed. Rep. of Germany ....... 3224234

[51] Int. Cl.³ .................... C23C 13/02; C23C 13/04
[52] U.S. Cl. .................................. 427/79; 427/154; 427/255.5; 427/259; 427/282; 118/718; 118/721
[58] Field of Search .................. 118/718, 721; 427/91, 427/259, 156, 272, 255.5, 79, 154, 282

[56] References Cited

U.S. PATENT DOCUMENTS 2,898,241  8/1959  Charlton et al. .................... 118/718

FOREIGN PATENT DOCUMENTS 1521588  9/1966  Fed. Rep. of Germany .
1262732  3/1968  Fed. Rep. of Germany .
2652438  5/1978  Fed. Rep. of Germany .

Primary Examiner—John P. McIntosh
Attorney, Agent, or Firm—Herbert L. Lerner; Laurence A. Greenberg

[57] ABSTRACT

Method for preparation of metal-free strips in the metal vapor deposition of an insulating tape intended for use in electric capacitors, in which the insulating tape is covered, in the region of the metal-free strips to be prepared, by an endless cover tape which rests against the insulating tape and travels along with the same velocity as the former and is coated with oil on the side facing the metal evaporator before entering the vapor deposition zone. The invention is characterized by the features that first, the insulating tape and the cover tape are brought into contact with each other; that then by vapor deposition of oil, a film is prepared which also covers the lateral surfaces of the cover tape as well as slightly adjacent areas, and whereupon the metal vapor deposition takes place.

6 Claims, 7 Drawing Figures

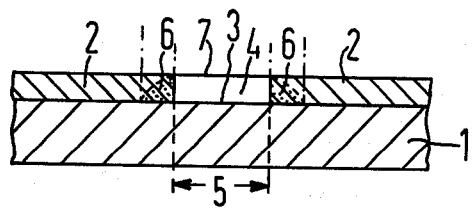
PRIOR ART FIG 1
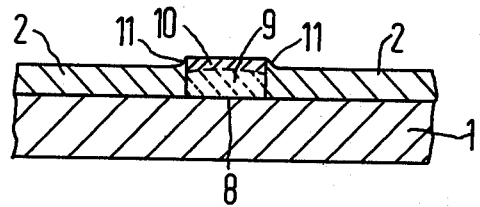
PRIOR ART FIG 2
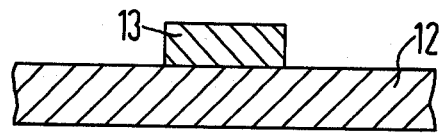
FIG 3
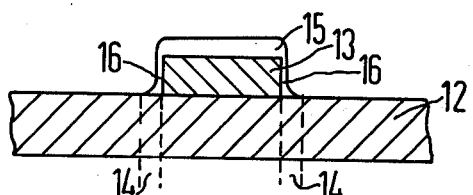
FIG 4
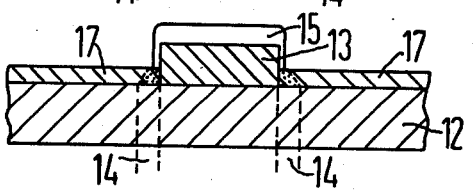
FIG 5
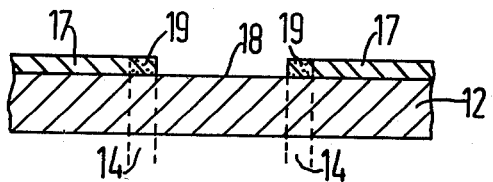
FIG 6

METHOD FOR THE PREPARATION OF METAL-FREE STRIPS IN THE METAL VAPOR DEPOSITION OF AN INSULATING TAPE

BACKGROUND OF THE INVENTION

1. Field of the Invention

The invention relates to a method for the preparation of metal-free strips in the metal vapor deposition of an insulating tape which is intended for use in electric capacitors, in which the insulating tape is covered in the region of the metal-free strips to be prepared, by an endless cover tape which rests against the insulating tape and travels along with the same velocity as the former. The cover tape is coated with oil on the side facing the metal evaporator before entering the vapor deposition zone. After traversing the vapor deposition zone and, after the cover tape and the insulating tape go their different ways, the cover tape is freed of vapor-deposited metal by stripping it off.

The invention further relates to apparatus for carrying out the method, which contains a cooling cylinder; a metal evaporator which is arranged, in the travel direction of the covering tape, ahead of the metal evaporator; supply rolls of the tapes to be metallized, and a cleaning device which is arranged in the travel direction ahead of the oil evaporator.

2. Description of the Prior Art

A method for preparing metal-free strips in the metal vapor deposition of tape is shown in U.S. Pat. No. 2,898,241. This method attempts to achieve a delineation as sharp as possible of the metal layer applied to the insulating tape. By using mask-like apertures above the metal evaporator, which are arranged at a larger distance from the insulating tape, the edges of the metal strip produced decrease toward the surface of the insulating tape. If this gradual transition is to be replaced by a sharp delineation of the metal strip, an endless cover tape which may if desired, be covered with wax, grease or oil, is used such that this tape runs past the metal evaporator in direct contact with the insulating tape and at the same velocity. After this cover tape is removed, the sharp edge desired there is produced. The covering of the metal-free strips carried out in this manner results in the oil film covering only the cover tape and does not extend slightly to the surface of the insulating tape. In particular, in the case of metal films which must be called thick in this connection (corresponding to a conductivity of up to 15 S), sharp edges are a disadvantage because they lead to breakdowns of the counterelectrode in the region of the edges; this applies particularly if the capacitors of such metallized insulating tapes are intended for a-c voltage and application for high voltages.

In German Published Prosecuted Application DE-AS No. 26 52 438, a method for preparing metal-free strips in the metal vapor deposition of an insulating tape are described. The method corresponds to what is described in U.S. Pat. No. 2,898,241. The same comments therefore apply to both cases.

From German Pat. No. 12 62 732 is furthermore known a method to prepare on an insulating tape strips free of metal by vapor-depositing covering means such as oil or grease on the parts of the tape to be left free. Vapor-deposition substances mentioned as suitable are diffelene, apiezone oil and silicone oils.

Both methods are not very suitable for preparing free margins for use in vapor-depositing relatively thick metal films, since an oil coverage cannot prevent metal precipitation in vapor-depositing thick layers, while a tape coverage of the type mentioned does not provide satisfactory results. If an additional coverage adjacent to the carrier is used, sharp edges, burrs and breaks even occur at the coatings, which can lead to damage to the capacitor to be wound.

SUMMARY OF THE INVENTION

An object of the present invention is to prepare neatly delineated metal-free strips on metallized plastic foils without a sharp-edged transition of the metal coatings to the metal-free strip. The method is usable for the preparation of thin (about 1 S) as well as for the preparation of thick aluminum coatings of, for instance, 10 S to 15 S sheet conductivity.

A further object of the invention is to provide an improved apparatus for carrying out the method of the invention.

With the foregoing and other objects in view, there is provided in accordance with the invention a method for the preparation of metal-free strips in the metal vapor deposition of an insulating tape which is intended for use in electric capacitors, which comprises covering the insulating tape in the region of the metal-free strips to be prepared, by an endless cover tape which rests against the insulating tape, causing the cover tape to travel along with the insulating tape at the same velocity, coating the cover tape with oil on the side to be exposed to metal vapors from metal in vapor deposition zone before entering said vapor deposition zone, subjecting the oil coated cover tape and insulating tape on which the cover tape rests to metal vapor deposition by passing them through the vapor deposition zone, after traversing the vapor deposition zone, thereafter separating the cover tape and the insulating tape to go their different ways, freeing the separated cover tape of vapor-deposited metal by stripping it off, the combination therewith of bringing the insulating tape and the cover tape into contact with each other, and while the two tapes are in contact applying by vapor deposition of oil an oil film which covers the top and lateral surfaces of the cover tape as well as slightly adjacent areas of the insulating tape, and thereafter effecting said metal vapor deposition.

In accordance with the foregoing, there is provided an apparatus for the preparation of metal-free strips in the metal vapor deposition of an insulating tape for use in electric capacitors, in which the insulating tape is covered in the region of the metal-free strips by an endless cover tape, comprising a rotating cooling cylinder, first deflector means for directing an insulating tape onto the cylinder, second deflector means for directing an endless cover tape onto the insulating tape to cover the region of the metal-free strips to be prepared, said insulating tape and said cover tape ratating together on the cylinder at the same velocity, an oil vaporizer equipped with an oil vapor nozzle disposed adjacent to the cylinder downstream from the point where the cover tape comes in contact with the insulating tape, said oil vapor nozzle for application of an oil film which covers the top and lateral surfaces of the cover tape as well as slightly adjacent areas of the insulating tape spaced about 0.3 to 0.6 mm from the cooling cylinder, a metal vaporizer for vapor-depositing metal on the insulating tape disposed in a region downstream from the oil vapor nozzle with the distance from the nozzle to the center of the vaporization region about 30 cm, deflector means for separating the cover tape from the insulating tape after metal deposition, and cleaning means for removing metal particles from the thus separated cover tape prior to again being subjected to an oil coating.

Other features which are considered as characteristic for the invention are set forth in the appended claims.

Although the invention is illustrated and described herein as embodied in method for the preparation of metal-free strips in the metal vapor deposition of an insulating tape, and apparatus for carrying out the method, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which:

FIG. 1 illustrates in a cross-sectional view an insulating tape provided with metal coating and metal-free strips according to the state of the art, FIG. 2 likewise shows another insulating tape provided with metal coating and metal-free strips according to the state of the art, FIGS. 3 to 6 diagrammatically illustrate insulating tape and cover tape in the various fabrication steps of the method of the present invention to produce metal-free strips, and FIG. 7 schematically shows the apparatus for carrying out the method of the invention.

DETAILED DESCRIPTION OF THE INVENTION

Figure 7:
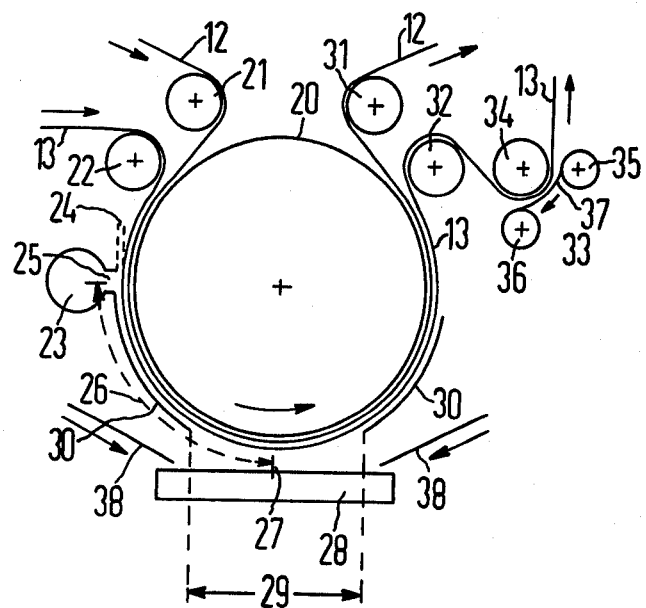

According to the invention, the method is characterized by the feature that first, the insulating tape to be metallized and the cover tape are brought into contact with each other; that then, a film is prepared by vapor deposition of oil which deposits on the cover tape end also covers the lateral surfaces of the cover tape as well as, to a slight extent, also covers the adjacent surface regions of the insulating tape; thereafter the metal vapor deposition takes place. The co-rotating endless cover tape preferably consists of a polyimide foil and have a thickness of 0.1 to 0.2 mm, because such a tape has, on the one hand, sufficient mechanical strength and, on the other hand, the shading effect of the oil vapor stream is negligible with tape of a thickness in the range given.

The oil film is preferably applied with a width which exceeds the width of the cover tape in the adjacent area of the insulating tape by 0.05 to 0.2 mm.

The width of the adjacent areas of 0.05 to 0.2 mm, respectively, has the effect that the thickness of the oil film, due to the surface tension of the oil and the scattering effect of the oil jet, goes from the cover tape, steadily decreasing, toward zero in a range advantageous for the later metal layer.

It is further advantageous to produce the oil film by vaporizing the oil from a nozzle, with the distance of the nozzle from the surface of the cover tape from 0.3 to 0.5 mm.

The oil vaporizer nozzles themselves have practically rectangular cross sections of a width which corresponds to the width of the cover tape. The oil vapor is distributed uniformly over the cover tape and to a diminishing degree over the edge thereof (scatter effect) through the size of the nozzle and the distance between the nozzle and the surface of the cover tape. Depending on the width of the cover tape, two or more oil vaporizer nozzles with smaller aperture widths may be arranged transversely to the travel direction thereof.

The temperature of the oil evaporator is preferably 200±20° C., especially if diffelene oil is vapor-deposited. The mentioned temperature of the oil evaporator has the effect of not thermally overstressing the insulating tape to be vapor-deposited.

The method of the invention has the advantage that on the one hand, definitively delineated metallizations are obtained but that, on the other hand, no vertically upward-directed burr is formed at the edges of electrode surfaces and that serrated electrodes are avoided. The metal cover can be stripped off the cover tape without damaging this tape, and no metal residue can get to the insulating foil when it again enters the evaporation zone. In order to remove as far as possible initially strongly adhering metal residues which might dissolve in a new passage through the vapor deposition zone, it is advantagious and sufficient if the vapor-deposited metal is stripped off immediately after leaving the vapor deposition zone and prior to a new coating with oil. Thereby adhering metal layers which might be loosened in the vicinity of deflection rolls which bend the cover tape in different directions is prevented.

The invention has the further advantage that the cover tape does not rise after the metal vapor deposition in the guide slots which are customarily used as guidance means and are arranged at the circumference of guide rolls, which may be the case with a thick vapor deposition without oil cover due to the widening of the tape. Thereby, the cover tape would lose its direction.

Due to the reasons mentioned, namely, because of the danger that loosened metal layers might remain at the cover tape and could get to the insulating tape, the method known from German Published Non-Prosecuted Application DE-OS No. 15 21 588 is not suitable for solving the problem either, in which a shielding tape is freed of precipitated metal by being conducted over a deflection roll, the metal layer flaking off due to the curvature of the deflection roll.

The method according to the invention not only reduces the precipitation on the cover tape but also its thermal stress related thereto. The oil film which covers the lateral surfaces of the cover tape also slightly wets the adjoining foil web and thereby also reduces the aluminum deposit in the boundary zone from the coating to the metal-free strip, so that the development of a sharp coating edge pointing away from the tape surface does not take place. Thereby serrated coating edges or a burr produced at the coating edge is prevented. On the other hand, undesirable shading of larger regions of the capacitively effective area is eliminated because of the small thickness of the oil film.

In addition to diffelene oil, apiezone oil or silicone oil can also be used for producing the oil film.

The apparatus for carrying out the method described at the outset is characterized, according to the invention, by the feature that in the travel direction of the insulating tapes to be vapor-coated, the distance between the nozzle of the oil vaporizer and the center of the metal vapor deposition zone is about 30 cm and that the distance between the nozzle of the oil evaporator and the cooling cylinder is about 0.3 to 0.6 mm.

In the following, the invention will be juxtaposed to the state of the art and explained in greater detail, making reference to the drawings.

FIG. 1 shows an insulating tape 1 which is metallized according to the state of the art (for instance, German Pat. No. 12 62 732), by use of an oil covering. The metal coatings 2 which consist, as it does also in the present invention, preferably of aluminum or aluminum alloy, are made by metal vapor deposition. The strip 3 which is free of metal, is the result of the oil cover 4. The width 5 of the metal-free strip 3 depends on the width of the oil evaporator nozzle. On both sides of the metal-free strip 3 there is a so-called "gray area" 6 which is generated by the thickness decrease of the oil cover 4 which is due to the production method and practically cannot be influenced.

The difficulty which arises with this kind of fabrication of metal-free strips in metal vapor deposition of an insulating tape is the fact that metal particles are likewise generated as metal residue 7 on the oil cover 4 during the metal vapor deposition. Since the oil cover 4, present as an oil strip, is not removed but wound into the capacitor to be fabricated, these metal residues 7 may form conduction bridges between the metal coatings 2. If, for instance, the metal-free strip 3 is a separation of the two metal coatings in a capacitor with so-called internal series connection, in which the metal coatings are arranged on both sides of the insulating tape acting as the dielectric in a staggered manner, so that a series circuit of capacitively active areas results, then the metal residue has an adverse effect. Also when separating a metallized insulating tape for the purpose of making individual capacitor foils, in which this separation is made in the center of the metal-free strip 3 in the lengthwise direction of the insulating tape, the effect of the metal residue is such that conductance bridges to the metallization can be formed, which are located at the end face produced after the capacitor is wound. A contact is harmful there, and more specifically alternating from layer to layer.

In FIG. 2, the insulating tape is likewise designated 1, because it also is metallized according to the state of the art, for instance, in accordance with the method described in U.S. Pat. No. 2,898,241. The metal coatings 2 which also are prepared here by metal vapor deposition, leave a strip 8 free of metal which was the result of the cover tape 9 (shown here to the left by dotted lines) which runs along with the insulating tape. In this embodiment, the aluminum deposit leads to a heavy increase of the aluminum layer 10 on the upper surface of the cover tape 9 and also at the long sides thereof, so that the tape material of the cover tape as well as of the insulating tape to be metallized is thermally heavily stressed. In the passage of such a tape, widened by aluminum growth, through the slots of the guide rolls at the vapor deposition device which are of necessity made with narrow tolerances, the tape is lifted on one side from the slot bottom and rises at the flank. This means a change of the position of the metal-free strip between the aluminum coatings 2. Due to the rising and the thermal stress, the cover tape 9 expands whereby, finally, the course of the tape is completely changed, so that the metal-free strip is produced at undesirable points; the cover tape may even be torn off. With increasing growth of the aluminum layer 10 on the cover tape 9, aluminum particles are separated more and more frequently and get into the winding made from the metallized insulating tape. In the further processing of the metallized insulating tape for the purpose of producing individual capacitors, this contamination leads in part to considerable difficulties. Not least, the boundary zone between the coating 2 and the metal-free strip 8 is formed as a sharp edge 11 of metal which points practically vertically upward. Such sharp edges lead to faults in the capacitor winding.

In the method according to the present invention (see FIGS. 3 to 6), the insulating tape 12 to be metallized is first brought together with the cover tape 13. The insulation tape 12 and the cover tape 13 together then with the same velocity enter into the region of the oil vapor deposition, where the cover tape 13 as well as the areas 14 adjoining on both sides are provided with an oil film. The surfaces 16 on the longitudinal side of the cover tape 13 are likewise covered by the oil film. Then, the insulating tape 12 together with the cover tape 13 and the oil film 15 gets into the area of the metal vapor evaporator, where the metal coatings 17 are generated. These metal coatings may be made of aluminum or aluminum alloy or any other metal that can be vapor-deposited.

In the area of the adjacent surface regions 14, the thickness of the oil films decreases continuously down to the value zero. Accordingly, a metal layer is produced, the thickness of which decreases from the metal coating 17 to the cover tape 13; this metal layer is permeated by oil and forms the edge region 19 of the metal coatings 17.

After the cover tape 13 is removed together with the oil film 15 deposited thereon and the metal particles also deposited thereon, a metal-free strip 18 is produced which is free of any residue of metal particles.

The "gray areas" (so called because in transilluminating the metallized foil, the transition area appears gray, just as a gray area is seen if transparent adhesive tape is pressed on and is pulled off again, the metal-free strip beyond the edge regions) in the areas 14 adjoining the metal-free strip 18 are present here in a manner similar to that explained in connection with FIG. 1. However, the width of these regions is defined, and due to the method of the present invention, a development of metal residue does not come about, and the edges 19 of the metal coatings 17 do not protrude from the plane of the surface of the metal coatings 17.

Thus, the oil film in the areas 14 on the insulation foil immediately next to the cover tape 13 reduces the deposition of coating metal on the insulation tape 12 during the vapor deposition process with the result that the edge is formed in the manner described in the transition region from the metal coating 17 to the metal-free strip 18.

Due to the oil film 15, the adhesion of the metal layer on the cover tape 13 is reduced. Thereby, the precipitate can be easily removed from the tape in the cleaning device, for instance, by wiping with felt. The heavy growth of the metal (aluminum) on the cover tape 13 is eliminated and therewith, all difficulties which are expounded in the explanation of FIG. 2.

Not last, the deposition of metal on the cover tape 13 is reduced, whereby the thermal stress of the tape material is also reduced.

The apparatus for carrying out the method is schematically shown in FIG. 7. From a supply reel (not shown here) the insulating tape 12 to be metallized moves via a deflection roll 21 to the surface of the cooling cylinder 20. The endless cover tape 13 moves via the deflection roll 22 to the insulating tape 12 in contact therewith at the point provided therefor. The insulating tape 12 and the cover tape 13 together move with the same velocity at the cooling cylinder 20 through the rotation of the latter, in the vicinity of the oil evaporator 23. The distance 24 of the nozzle 25 of the oil evaporator 23 from the cover tape 13 is preferably 0.3 to 0.5 mm. The distance 26 of the nozzle 25 of the oil evaporator 23 to the center 27 of the metal vapor deposition area 29 is about 30 cm. Into the metal evaporator 28, wires 38 of the metal to be evaporated are introduced, as is known.

In the metal vapor deposition area 29 above the metal evaporator 28, the metal coatings are generated. The metal vapor deposition area is defined by shielding parts 30.

Shortly before the insulating tape 12 provided with the metal coating leaves the cooling cylinder 20 at the deflection roll 31, the cover tape 13 is lifted off the insulating tape 12 via the deflection roll 32 and conducted to the cleaning station (cleaning device) 33. The cleaning device 33 consists of a deflection roll 34, two rolls 35 and 36 and a cleaning tape 37 which is conducted over the cover tape 13 in the opposite direction. After the cover tape 13 leaves the cleaning device 33 (not shown here), the cover tape is returned to the deflection roll 22.

There are claimed:

1. Method for the preparation of metal-free strips in the metal vapor deposition of an insulating tape which is intended for use in electric capacitors, which comprises covering the insulating tape in the region of the metal-free strips to be prepared, by an endless cover tape having a top, bottom and lateral surfaces, only the bottom surface of which rests against the insulating tape, causing the cover tape to travel along with the insulating tape at the same velocity, coating the cover tape with oil on the side to be exposed to metal vapors from metal in a vapor deposition zone before entering said vapor deposition zone, subjecting the oil coated cover tape and insulating tape on which the cover tape rests to metal vapor deposition by passing them through the vapor deposition zone, after traversing the vapor deposition zone separating the cover tape and the insulating tape to go their different ways, freeing the separated cover tape of vapor-deposited metal by stripping it off, the combination therewith of bringing the insulating tape and the cover tape into contact with each other, and while the two tapes are in contact applying by vapor deposition of oil an oil film which covers the top and lateral surfaces of the cover tape as well as slightly adjacent areas of the insulating tape, and thereafter effecting said metal vapor deposition.

2. Method according to claim 1, wherein the cover tape is a co-rotating endless cover tape with a thickness of 0.1 to 0.2 mm.

3. Method according to claim 2, wherein the oil film is applied in a width which exceeds the width of the cover tape on the adjoining areas by 0.05 to 0.2 mm each.

4. Method according to claim 1, wherein the oil film is applied in a width which exceeds the width of the cover tape on the adjoining areas by 0.05 to 0.2 mm each.

5. Method according to claim 1 or 2 or 4 or 3, wherein the oil film is applied by directing the oil vapor from a nozzle disposed a distance of 0.3 to 0.5 mm from the surface of the cover tape.

6. Method according to claim 1 or 2 or 4 or 3, wherein the oil vapor deposited is diffelene oil, and wherein the temperature of the oil evaporator is $200 \pm 20°$ C.

* * * * *